(12) United States Patent
Eibel et al.

(10) Patent No.: US 7,003,048 B1
(45) Date of Patent: Feb. 21, 2006

(54) COMMUNICATION ARRANGEMENT COMPRISING POWERFUL INTEGRATED AMPLITUDE-MODULATION MEANS

(75) Inventors: Thomas Eibel, Gratwein (AT); Siegfried Arnold, Graz (AT); Peter Thüringer, Graz (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 700 days.

(21) Appl. No.: 09/649,678

(22) Filed: Aug. 28, 2000

(30) Foreign Application Priority Data

Aug. 31, 1999 (EP) .................................. 99890280

(51) Int. Cl.
H04L 27/04 (2006.01)
(52) U.S. Cl. ...................... 375/295; 375/300; 332/149
(58) Field of Classification Search ................ 375/295, 375/268, 269, 270, 353, 300, 298, 302; 332/149–182
See application file for complete search history.

(56) References Cited

U.S. PATENT DOCUMENTS

| | | | |
|---|---|---|---|
| 3,904,965 A | | 9/1975 | Leuthold .................... 325/141 |
| 4,529,950 A | | 7/1985 | Chazenfus et al. | |
| 5,144,314 A | * | 9/1992 | Maimberg et al. ............ 342/44 |
| 5,548,291 A | * | 8/1996 | Meier et al. .................. 342/51 |
| 6,167,094 A | * | 12/2000 | Reiner ......................... 375/258 |
| 6,427,065 B1 | * | 7/2002 | Suga et al. .................... 455/41 |
| 6,547,149 B1 | * | 4/2003 | Wuidart et al. ............. 235/492 |

* cited by examiner

Primary Examiner—Temesghen Ghebretinsae
Assistant Examiner—Sam K. Ahn
(74) Attorney, Agent, or Firm—Kevin Simons (57) ABSTRACT

In a communication arrangement (1) provided for transmitting data (DA) to a transponder (2) which arrangement includes a data source (5) for delivering data (DA) and includes a carrier signal generator (6) for generating a carrier signal (CS) and includes modulation means (7) to which can be applied the data (DA) and the carrier signal (CS) and which modulation means are provided for modulating a carrier signal (CS) in accordance with the data (DA) and for delivering a modulated carrier signal (CSM) to transmitting means (8) having an input resistance (9), the modulation means (7) have a changeable output resistance (10) which forms a resistance network together with the input resistance (9) of the transmitting means (8), and resistance change means (25) for changing the output resistance (10) in accordance with the data (DA).

7 Claims, 6 Drawing Sheets

COMMUNICATION ARRANGEMENT COMPRISING POWERFUL INTEGRATED AMPLITUDE-MODULATION MEANS

BACKGROUND OF THE INVENTION

The invention relates to a communication arrangement as defined in the pre-characterizing part of claim 1.

Such a communication arrangement has been developed and marketed by the applicants and is therefore known.

In the known communication arrangement, a data source delivers data in the form of a sequence of logic ones and zeroes to modulation means. Furthermore, a high-frequency carrier signal, which can be produced by a carrier signal generator is fed to the modulation means. The modulation means modulate the carrier signal in accordance with the data and deliver a modulated carrier signal to an antenna current drive belonging to the modulation means. The antenna current drive has a fixed gain. The antenna current drive further has on the input side a high input resistance so as not to burden or distort the modulated carrier signal. On the side of the output, the antenna current drive has a nominally constant and low output resistance for driving an antenna current via an antenna circuit input resistance of typically several dozen Ohms.

The data source, the carrier signal generator and the modulation means are realized as component parts of an integrated circuit. With a design of the communication arrangement for transmitting data over a distance of up to 10 cm, the antenna current drive is realized as a discretely built two-stage C-amplifier separated from the integrated circuit because of the dissipation power that shows up, with which amplifier an adequate transmission power of the communication station may easily be achieved. For the reliable operation the antenna current drive further has appropriately dimensioned cooling means and stabilizing means for combating an undesired temperature drift.

In the known communication arrangement the modulation which can be performed with the modulation means is based on the principle of amplitude modulation. In dependence on the data, the amplitude of the carrier signal is changed then. For this purpose, the carrier signal is applied to two parallel-arranged buffer amplifiers which have an identical gain. The first buffer amplifier is driven with a first supply voltage and the second buffer amplifier is driven with a second supply voltage. For performing the amplitude modulation in dependence on the data, either the first buffer amplifier or the second buffer amplifier is connected to the antenna current drive, so that two different amplitudes of the carrier signal to be amplified are present on the input side of the antenna current drive in a time sequential manner.

The first supply voltage of the first buffer amplifier is fixed and the second supply voltage is generated via voltage values which are preprogrammed in an EEPROM. This basically realizes an amplitude modulation of the carrier signal with different degrees of modulation.

The use of two buffer amplifiers and the generation of the second supply voltage according to the voltage values preprogrammed in the EEPROM implies considerable circuitry and cost in the known communication arrangement and guarantees only a relatively coarse possibility of changing the degree of modulation. Furthermore, the antenna drive can only be adapted to various antenna circuits with difficulty and with considerable expenditure. The design of the antenna drive as a C-amplifier to guarantee the necessary transmission powers is the further obstruction to an integration of the antenna drive with the further components of an integrated circuit of the communication arrangement. In practice, however, in connection with such a communication arrangement as defined in the pre-characterizing part of claim 1, there has often been the desire to have a complete integration of the modulation means. Furthermore, it is desired that the modulation means must also have a considerably simpler design.

SUMMARY OF THE INVENTION

It is an object of the invention to avoid the problems with the communication arrangement of the type defined in the pre-characterizing part of claim 1 and realize an improved communication arrangement which includes modulation means of a considerably simpler structure and which are completely integrable.

To achieve the object defined above, the communication arrangement of the type in accordance with the pre-characterizing part of claim 1 has the characteristic features in accordance with the characterizing part of claim 1.

By providing the characteristic features according to the invention and as claimed in claim 1, simplified modulation means can be realized in an advantageous manner. Providing a modifiable output resistance of the modulation means for the purpose of modulating the amplitude of a carrier signal has proved to be highly advantageous in this connection. Dimensioning the modifiable output resistance in a respective low value range allows a direct, thus unamplified delivery of the modulated carrier signal to the input resistance of the transmission means, so that a source of considerable power loss in the form of an amplifier is omitted and thus a complete integration of the modulation means is made simpler. A second advantage is achieved by the characteristic features according to the invention and as claimed in claim 1, because the omission of the source of considerable power loss is accompanied by the omission of cooling means and stabilizing means for an undesired temperature drift. Thus the advantage is achieved that a cost-effective communication arrangement can be realized with the modulation means of a considerably simpler structure.

Providing the characteristic features according to the invention and as claimed in claim 2 may achieve with the two partial resistances that the modifiable output resistance can be modified in a highly simple manner by combining the two partial resistances by the switching means. This combining requires only simple switching measures and, therefore, this combining can be realized in a simple manner. A further advantage is obtained by this combining that, with a first combination of the two partial resistances, for example, a first amplitude of a modulated carrier signal that can be delivered to the transmission means can be achieved and in that, with a second combination of the two partial resistances, for example, a second amplitude of a modulated carrier signal that can be delivered to the transmission means can be achieved.

The combining of the two partial resistances may basically be effected in a series or parallel circuit. Particularly advantageous, however, has appeared to be the provision of the characteristic feature according to the invention and as claimed in claim 3, because as a result of the fact that the switching means are provided for combining the two partial resistances in a parallel circuit makes it possible to have a considerably simpler technical realization of the combination of the two partial resistances than when the switching means are provided for combining the two partial resistances in a series circuit. A further advantage is obtained by providing the characteristic features according to the invention and as claimed in claim 3 in that with given resistance values of the two partial resistances the combining of the two partial resistances in a parallel circuit leads to a reduction of the resistance value of the output resistances below the resistance value of the larger resistance value of the two partial resistors, so that, compared to the combining of the two partial resistances in a series circuit, a higher transmission power can be delivered to the input resistance of the transmission means.

In a communication arrangement according to the invention and as claimed in claim 4, at least one of the two partial resistances may be arranged as a transistor which, in its turned-on state, forms a basic resistor connected in parallel to the other partial resistance. By providing the characteristic features according to the invention and as claimed in claim 4, the transistor can be driven in a simple manner by a voltage or a current.

The driver in the communication arrangement according to the invention may be realized, for example, in TTL technology, with the driver having bipolar transistors on the output side. The bipolar transistors, however, have a conductivity which is flawed by a positive temperature coefficient. In consequence, a compensation circuit must be provided, which avoids the bipolar transistors being destroyed by overheating. However, the driver may also be realized in MOS technology where it has field effect transistors on the output side. Forming at least one partial resistance by a field effect transistor is advantageous compared to forming it by a bipolar transistor, because a basic resistance that is formed by the field effect transistor and can be combined with another partial resistance is realized in a simple manner in that a fundamental physical property of a field effect transistor is used. When field effect transistors are used, a compensation circuit can be omitted, so that a simple parallel circuit is made possible. According to the characteristic feature as claimed in claim 5, realizing the driver as a CMOS driver has proved to be highly advantageous, because the use of CMOS technology implies the use of cost-effective technology nowadays. A further advantage is obtained in that the CMOS driver has two complementary field effect transistors on the output side, which can be used advantageously and in a flexible manner for combining the partial resistances.

Providing the characteristic features according to the invention and as claimed in claim 6 offers the advantage that when at least one of the two partial resistances can be changed in dependence on the combining the two partial resistances, either a first amplitude or a second amplitude can be changed irrespective of each other during an amplitude modulation of the carrier signal, or that the two amplitudes can be changed in dependence on each other. A degree of modulation of the modulated carrier signal defined as a function of these amplitudes can therefore be flexibly adapted to various requirements by finely adjusting the resistance value of the output resistance. This provides that the modulation means can be adapted accurately and flexibly relative to a degree of modulation of the modulated carrier signal by finely adjusting the changeable output resistance of the modulation means, which degree is to be generated during the amplitude modulation of the carrier signal. In this context it may particularly be pointed out that, with a given degree of modulation and with a given tolerance of this degree of modulation, a highly flexible change of the output power of the transmission signal produced by the transmission means can be carried through in a simple manner in that at least one partial resistance is changeable. As a result, postal limits for a power of the delivered transmission signal situated in sidebands of a spectrum during an amplitude modulation can be advantageously adhered to. A further advantage is obtained by providing the characteristic feature according to the invention and as claimed in claim 6 in that in this way the output resistance of the modulation means can be adapted in a simple and advantageous manner to the input resistance of the transmission means. In this way, resistance values and power values in different input resistances can be adapted relatively simply while at the same time a required degree of modulation continues to be adjustable.

By providing the characteristic features according to the invention, a changeable partial resistance is created in an advantageous manner, because switching on or switching off a switchable driver can be controlled directly by means of digital signals, thus realizing a considerably simplified amplitude modulation.

By providing the characteristic feature according to the invention the advantage is offered that by switching individual switchable drivers which have different basic resistances on and off, a partial resistance is realized which, as regards the resistance value, can be changed over a large range and can be realized extremely efficiently and, therefore, also cost-effectively.

By providing the characteristic feature according to the invention, the advantage is offered that with a group of parallel arranged drivers which form a partial resistance and have a common complementary transistor, there is a considerable saving of costs especially when there are many drivers.

By providing the characteristic feature according to the invention, the advantage is offered that the circuit design of the integrated circuit can be realized in a considerably simpler, room-saving and cost-effective manner. The at least one driver can be simply realized with all the other components of the modulation means in standardized technology and with a single design and manufacturing method. Therefore, this enables a highly efficient use of available resources, which again adds to a highly competitive production of the integrated circuit.

The aspects defined above and further aspects of the invention will be evident from the six examples of embodiment described hereinafter and will be explained with reference to these examples of embodiment.

BRIEF DESCRIPTION OF THE DRAWING

The invention will be further described in the following with reference to six examples of embodiment shown in the drawings, to which, however, the invention is not restricted.

DESCRIPTION OF THE PREFERRED EMBODIMENTS

Figure 1:
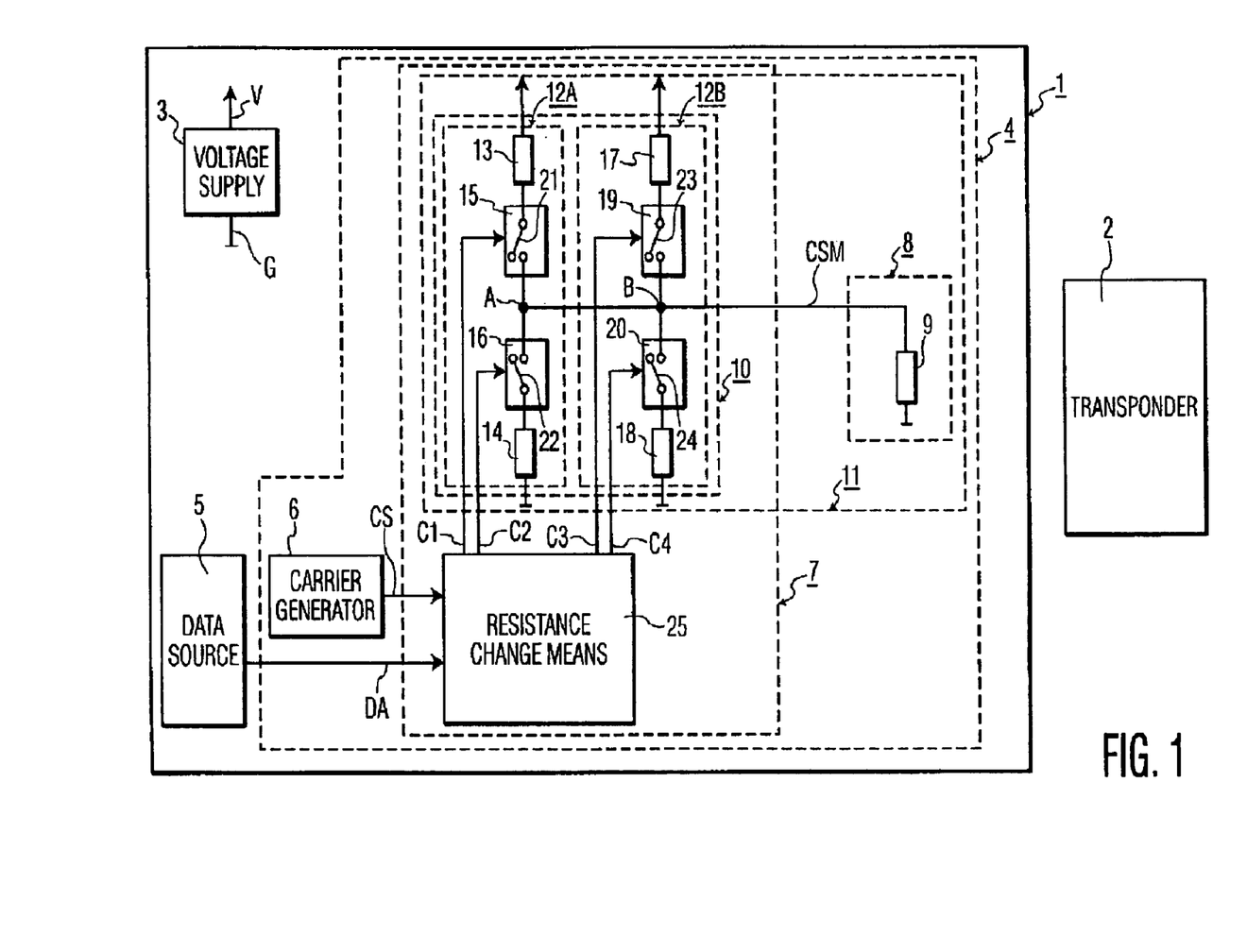
FIG. 1 shows in diagrammatic manner in the form of a block diagram a part that in the present context is essential to a communication arrangement in accordance with a first example of embodiment of the invention.

FIG. 1 shows in the form of a block diagram a communication arrangement 1 by which data DA can be transmitted to a transponder 2.

The communication arrangement 1 includes a voltage supply means 3 which is arranged as a part of a logic system and which is provided for delivering a supply voltage V with respect to ground G. The supply voltage V is used for supplying power to an electric circuit 4.

The communication arrangement 1 comprises a data source 5 which is provided for delivering the data DA. The data source 5 is part of a digital interface (not shown) to which can be applied digital information signals as data by a computer (not shown) which is external to the communication arrangement 1. On account of a normally required high processing rate, the digital information signals, which can be received via the digital interface, normally occur as a parallel representation of logic ones and zeroes and are converted in the data source 5 into a serial representation of logic ones and zeroes. The serial representation is further subjected to a coding after which the transmission data DA are received that form a serial sequence of logic ones and zeroes generated in accordance with the chosen coding.

The communication arrangement 1 further includes a carrier signal generator 6 which is provided for generating a carrier signal CS and for transferring the carrier signal CS. In the communication arrangement 1 according to the invention, the carrier signal CS has a frequency of 13.56 MHz.

The communication arrangement 1 includes modulation means 7 to which can be applied, on the one hand, the carrier signal CS and, on the other hand, the data DA. The modulation means 7 are provided for modulating the carrier signal CS in accordance with the data DA, while the carrier signal CS is amplitude modulated during the modulation. Accordingly, an amplitude of the carrier signal CS is changed in accordance with the data DA, so that a modulated carrier signal is generated. The modulation means 7 are provided for transferring the modulated carrier signal, thus an amplitude-modulated carrier signal CSM.

The amplitude-modulated carrier signal CSM has at least two different amplitudes and in the present case a first amplitude is referenced a carrier amplitude and a second amplitude is referenced a modulation amplitude. Customarily, the carrier amplitude is larger than the modulation amplitude, so that with the aid of the two amplitudes a positive degree of modulation can be computed. The degree of modulation is usually denoted in a percentage, while a match of the carrier amplitude and the modulation amplitude corresponds to a zero percent degree of modulation and an infinitesimal modulation amplitude compared to the carrier amplitude corresponds to a one hundred percent degree of modulation. For the case where the carrier amplitude is smaller than the modulation amplitude, there is mention of a negative degree of modulation.

The communication arrangement 1 includes transmission means 8 which are arranged as an oscillation circuit comprising a transmission coil (the oscillation circuit and the transmission coil are not shown). At the carrier signal frequency CS the transmission means 8 have a nominally constant input resistance 9. The amplitude-modulated carrier signal CSM can be applied to the transmission means 8 by the modulation means 7.

For this purpose, the modulation means 7 have an output resistance 10 which, together with the input resistance 9 of the transmission means 8 forms a resistor network 11. During a first half period of the carrier signal CS the oscillation circuit is connected to the supply voltage V via the output resistance 10 by means of the resistor network 11, so that a charging current flows through the output resistance 10 and causes the oscillation circuit to be charged. During a second half period of the carrier signal CS, the oscillation circuit is connected to ground G via the output resistance 10 by means of the resistor network 11, so that a discharging current flows via the output resistance 10 and causes the oscillation circuit to be discharged. By switching over between the charging current and the discharging current, the oscillation circuit is charged and discharged with the frequency of the carrier signal CS, so that the oscillation circuit is triggered to oscillate and an oscillating magnetic field is induced in the neighborhood of the transmitting coil. The magnetic field has a magnetic field amplitude which is proportional to the strength of the change of current. After the input resistance 9 of the transmission means 8 is constant, the strength of the current change is defined by the output resistance 10 of the modulation means 7.

In the communication arrangement 1 according to the invention, the output resistance 10 of the modulation means 7 is advantageously arranged in a changeable version. By means of the changeable output resistance 10, different strengths of the current change can be produced.

The changeably arranged output resistance 10 of the modulation means 7 can be combined from a first partial resistance 12A and a second partial resistance 12B. Furthermore, the communication arrangement 1 according to the invention includes switching means SM for combining the two partial resistances. The switching means SM are provided for connecting the two partial resistances in parallel.

The first partial resistance 12A is formed by a first resistor 13 and a second resistor 14, a first switch 15 and a second switch 16. To the supply voltage V is connected the first resistor 13 to which the first switch 15 is connected in series. To the first switch 15 is connected in series the second switch 16, to which the second resistor 14 is connected in series. The second resistor 14 is further connected to ground G. Between the first switch 15 and the second switch 16 there is a connection point A.

The second partial resistance 12B is formed by a third resistor 17 and a fourth resistor 18, a third switch 19 and a fourth switch 20. To the supply voltage V is connected the third resistor 17 to which the third switch 19 is connected in series. To the third switch 19 is connected in series the fourth switch 20, to which the fourth resistor 18 is connected in series. The fourth resistor 18 is furthermore connected to ground G. Between the third switch 19 and the fourth switch 20 there is a connection point B which is connected, on the one hand, to the connection point A and, on the other hand, to the transmission means 8.

The switching means SM are in the form of a first switch 15 and a second switch 16, a third switch 19 and a fourth switch 20. The switches 15, 16, 19 and 20 are formed by electronic switches. The first switch 15 has a first make contact 21, the second switch 16 has a second make contact 22, the third switch 19 has a third make contact 23 and the fourth switch 20 has a fourth make contact 24. Each make contact 21, 22, 23 and 24 can be controlled electronically and is open in an idle state and closed in a working state. For electronically controlling the make contacts 21, 22, 23 and 24, a first control signal C1 is fed to the first make contact 21, a second control signal C2 to the second make contact 22, a third control signal C3 to the third make contact 23 and a fourth control signal C4 to the fourth make contact 24. The control signals C1, C2, C3 and C4 may adopt an inactive state or an active state. When one of the control signals adopts an inactive state, the respective make contact is in its idle state. When one of the control signals adopts an active state, the respective make contact is in its working state.

Furthermore, the communication arrangement 1 according to the invention includes resistance change means 25 for changing the changeable output resistance 10 of the modulation means 7 in accordance with the data DA. The resistance change means 25 are arranged for receiving the carrier signal CS and for receiving the data DA. Furthermore, the resistance change means 25 are provided for generating the control signals C1, C2, C3 and C4 from the data DA and the carrier signal CS, and for delivering the control signals C1, C2, C3 and C4. Generating the control signals C1, C2, C3 and C4 from the carrier signal CS and the data DA takes place in the communication arrangement 1 as shown in FIG. 1 by means of a logic circuit (not shown) included in the resistance change means 25.

An example of embodiment is used in the following to explain the function of the modulation means 7 which, in the present case, are formed in an advantageous manner by the changeable output resistance 10 and the resistance change means 25 provided for changing the output resistance 10.

According to the first example of embodiment it is assumed that the amplitude modulation is an amplitude modulation with a positive degree of modulation. It is further assumed that the modulation of the carrier signal CS is effected by the modulation means 7 in accordance with the data DA, so that the carrier amplitude is to be generated in case of a logic zero in the data DA and the modulation amplitude is to be generated in the case of a logic one in the data DA.

For generating the carrier amplitude, the resistance change means 25 generate the control signals so that the first control signal C1 and the third control signal C3 are simultaneously in the active state, whereas the second control signal C2 and the fourth control signal C4 are simultaneously in the inactive state. This forms a first output resistance which is in the form of a parallel circuit of the first resistor 16 of the first partial resistance 12A and the third resistor 17 of the second partial resistance 12B. The first output resistance makes a first charging current possible. After half a period of the carrier signal CS there is a first change of state in the resistance change means 25, so that the first control signal C1 and the third control signal C3 change from the active state to the inactive state, whereas the second control signal C2 and the fourth control signal C4 change from the inactive state to the active state. This forms a second output resistance which is in the form of a parallel circuit of the second resistor 14 of the first partial resistance 12A and the fourth resistor 18 of the second partial resistance 12B. The second output resistance makes a first discharging current possible. Furthermore, for the first control signal C1 and the third control signal C3, as well as for the second control signal C2 and the fourth control signal C4, there is an alternating first change of state between the inactive state and the active state, which leads to an alternating switching between the first charging current and the first discharging current. By means of the first output resistance and the second output resistance, a maximum value of the first charging current and a maximum value of the first discharging current is reached, while these maximum values satisfy the condition for generating the carrier amplitude in accordance with the first example of embodiment.

For generating the modulation amplitude, the resistance change means 7 generate the control signals C1, C2, C3, C4 so that, simultaneously, the first control signal C1 is in the active state and the second control signal C2 in the inactive state whereas, simultaneously, the third control signal C3 and the fourth control signal C4 are in the inactive state. Thus a third output resistance is formed by the first resistor 13 and the first partial resistance 12A. The third output resistance makes a second charging current possible. After half a period of the carrier signal CS, there is a second change of state in the resistance change means 25, so that the first control signal C1 changes to the inactive state and the second control signal C2 changes to the active state, whereas the state of the third control signal C3 and of the fourth control signal C4 is maintained. Thus a fourth output resistance is formed by the second resistor 14 of the first partial resistance. The fourth output resistance makes a second discharging current possible. Furthermore, for the first control signal C1 and for the second control signal C2 there is an alternating change of state between the inactive state and the active state, which leads to an alternating changing between the second charging current and the second discharging current.

According to Ohm's law, on the one hand, the second charging current is smaller than the first charging current and, on the other hand, also the second discharging current is smaller than the first discharging current. In consequence, also the magnetic field amplitude caused by the modulation amplitude of the amplitude-modulated carrier signal CSM is smaller than the magnetic field amplitude caused by the carrier amplitude of the amplitude-modulated carrier signal CSM.

By providing the changeable output resistance 10 and the resistance change means 25, a carrier signal CS can be simply modulated in accordance with the data DA. Therefore, essentially simplified modulation means 7 are provided, as the result of which also a cost-effective communication arrangement 1 can be realized. With the aid of the resistance change means 25, the changeable output resistance can be changed by a logic circuit included in the resistance change means 25. It has proved to be extremely advantageous to combine the changeable output resistance 10 from a first partial resistance 12A and the second partial resistance 12B and, for the purpose of combining the two partial resistances 12A and 12B, to provide switching means 15, 16, 19 and 20. The switching means 15, 16, 19 and 20 are in the present case advantageously provided for connecting the two partial resistances 12A and 12B in parallel, because this parallel combination causes the least circuit expenditure. Furthermore, the advantage is obtained that as a result of the parallel combination of the two partial resistances 12A and 12B always a high nominal transmission power can be produced on the input resistance of the transmission means, because the parallel combination of the two partial resistances causes a low nominal output resistance to occur.

Figure 2:
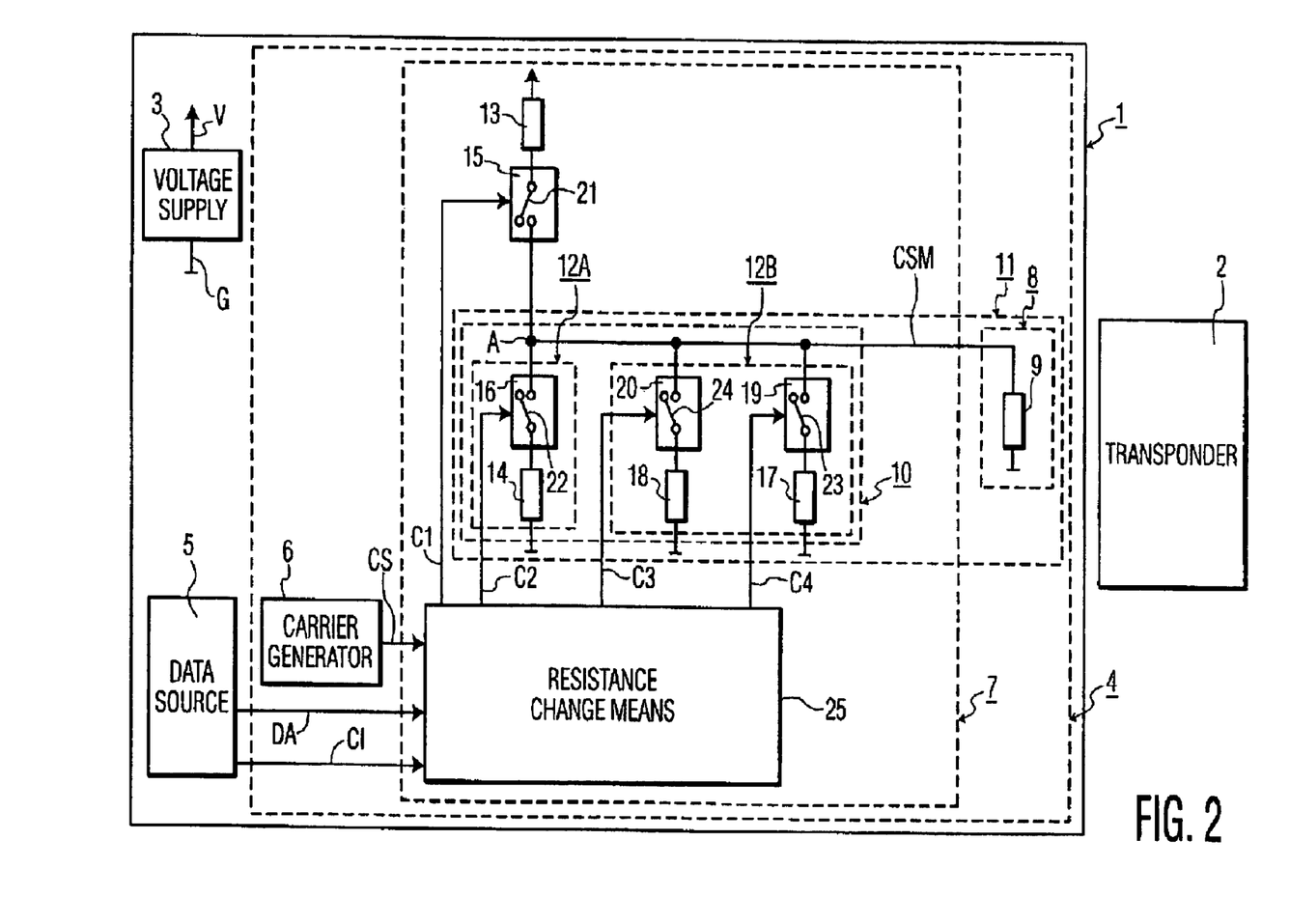
FIG. 2 shows in similar manner to FIG. 1 a communication arrangement in accordance with a second example of embodiment of the invention.

FIG. 2 shows in the form of a block diagram a communication arrangement 1 similar to the communication arrangement 1 shown in FIG. 1. The communication arrangement 1 shown in FIG. 2 includes a data source 5, which is additionally provided for delivering data DA and for delivering combined information CI, which combined information may contain a first combination, a second combination and a third combination of control signals C3 and C4. The control signals C3 and C4 are influenced by the combined information CI in that three different amplitude values can be set during the generation of the modulation amplitude, that is a first amplitude value in accordance with the first combination, a second amplitude value in accordance with the second combination and a third amplitude value in accordance with the third combination. Furthermore, the communication arrangement 1 shown in FIG. 2 includes resistance change means 25 which are arranged, in addition to receiving the carrier signal CS and the data DA, also for receiving the combined information CI. A first partial resistance 12A of the output resistance 10 is formed by the second resistor 14 and the second switch 16. In the case at hand the third resistor 17 is connected to the mains. In this way, also in this case the third resistor 17 is connected to the third switch 19 in a series combination. The third resistor 17 and the third switch 19, however, are included in a parallel circuit with the fourth switch 20 and the fourth resistor 18. The parallel combination forms a second partial resistance 12B. With the aid of the parallel combination, the second partial resistance 12B in this embodiment can be changed.

The function of the modulation means 7 is explained in the following with reference to a second example of embodiment. The assumptions of the first example of embodiment are valid here too.

The resistance change means 25 are arranged so that when a logic zero appears in the data DA, the carrier amplitude is generated, thus the combined information CI has no influence on the generation of the carrier amplitude. Furthermore, it is assumed that the second resistor 14, the third resistor 17 and the fourth resistor 18 have different values.

The resistance change means 25 are further arranged so that the second control signal C2 is always in a reverse state to the first control signal CI. Accordingly, the first control signal C1 is in the active state during the first half period of the carrier signal CS and the second control signal C2 is in the inactive state when the first control signal C1 is in the inactive state during the second half period and the second control signal C2 is in the active state. Accordingly, during the first half period a first output resistance is formed by the first resistor 13, which is arranged unchangeably in the case at hand.

For generating the carrier amplitude, the resistance change means 25 generate the control signals C3 and C4, so that the state of the control signal C3 and the state of the control signal C4 are identical with the state of the control signal C2. Thus the first output resistance is formed during the first half period, whereas during the second half period a second output resistance is formed by a parallel combination of the second resistor 14, the third resistor 17 and the fourth resistor 18. Furthermore, the alternating switching is achieved between a first charging current and a first discharging current, with the first discharging current assuming a maximum value and thus satisfying the condition for generating the carrier amplitude in accordance with the second example of embodiment.

For generating the modulation amplitude, the resistance change means 25 generate the control signals C3 and C4 in dependence on the combined information CI. In accordance with the first combination, the control signals C3 and C4 are in an inactive state during the first half period and during the second half period. Thus, during the second half period, a second output resistance is formed by the second resistor 14, so that there is a second discharging current which assumes a minimum value. For this minimum value there is the first amplitude value which is the smallest possible amplitude value of the modulation amplitude. According to the second combination, the third control signal C3 has equivalent states to the second control signal C2, whereas the fourth control signal C4 continues to be in an inactive state. During the second half period a third output resistance is then formed by a parallel circuit of the second resistor 14 and the third resistor 17, so that there is a second discharging current which assumes a first value between the maximum value and the minimum value and corresponds to a second amplitude value. According to the third combination, the fourth control signal C4 has equivalent states to the second control signal C2, whereas the third control signal C3 continues to be in an inactive state. During the second half period a third output resistance is then formed by a parallel combination of the second resistor 14 and the fourth resistor 18, so that there is a fourth discharging current which assumes a second value between the maximum value and the minimum value and which corresponds to a third amplitude value.

By providing the measure that the second partial resistance 12B is changeable, the advantage is offered that in the case at hand three different output resistances can be generated when the modulation amplitude is generated. On the one hand, for example for a given modulation amplitude, the output resistance 10 can be simply adapted by the resistance change means 25 to an input resistance 9 of the transmission means 8, so that an optimum delivery of the transmission power is reached. On the other hand, for example in the case of an amplitude modulation during which there is already a nominally adapted output resistance 10, three different modulation amplitudes can equally simply be generated by means of the resistance change means 25.

Figure 3:
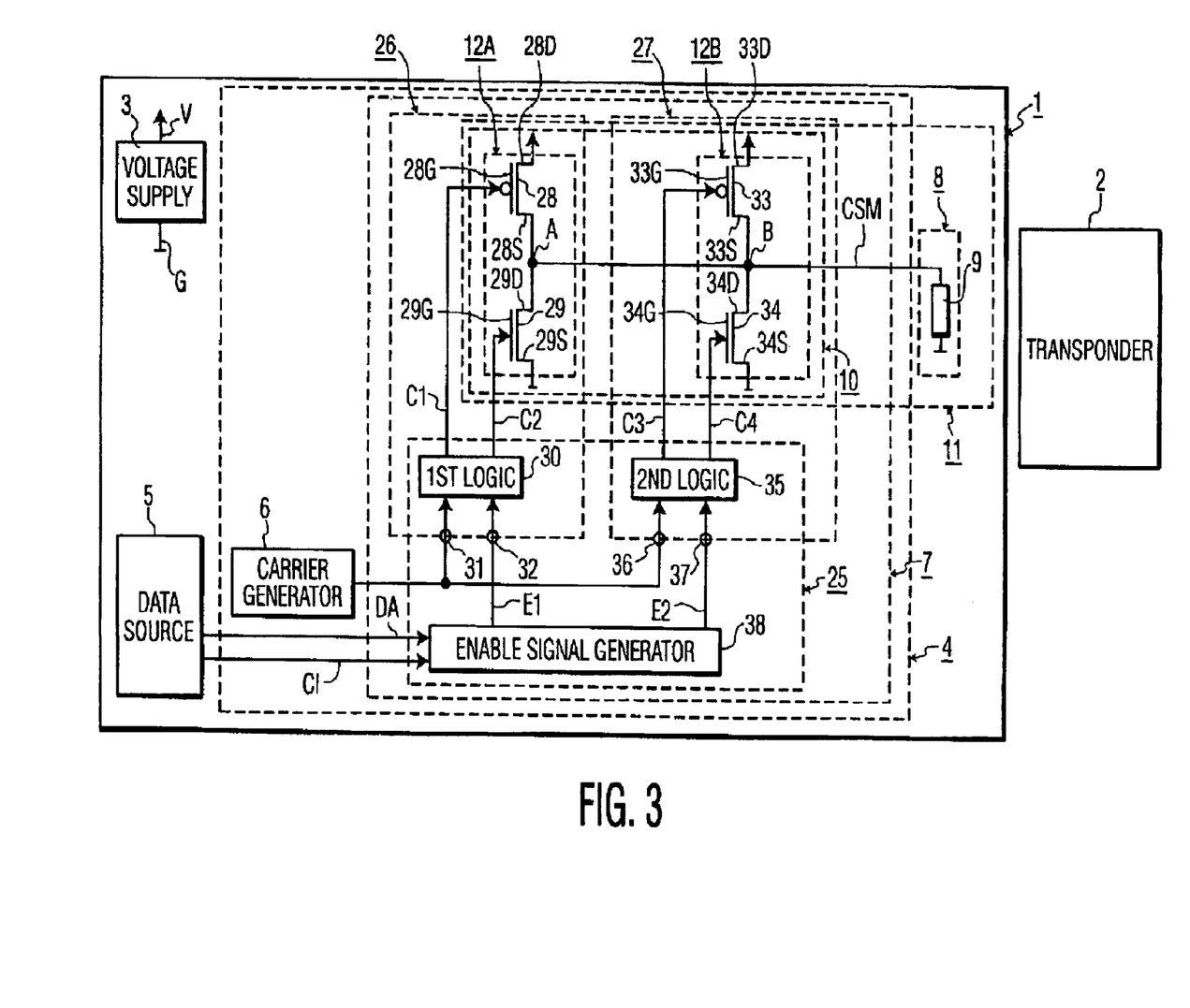
FIG. 3 shows in similar manner to FIG. 1 a communication arrangement in accordance with a third example of embodiment of the invention.

FIG. 3 shows in the form of a block diagram a communication arrangement 1 similar to the communication arrangement 1 shown in FIG. 1. The communication arrangement 1 shown in FIG. 3 includes a first partial resistance 12A which is realized by a first driver 26.

The first driver 26 has on the input side a first driver data input 31 and a first driver enable input 32. A first input logic 30 of the first driver 26 is connected to the first driver data input 31 and to the first driver enable input 32. The first driver data input 31, the first driver enable input 32 and the first input logic 30 form part of the resistance change means 25. To the first driver data input 31 can be applied the carrier signal CS. To the first driver enable input 32 can be applied a first enable signal E1, this first enable signal E1 being capable of adopting two states, that is an enable state or a blocking state. The first input logic 30 is provided for generating and delivering a first control signal C1 and a second control signal C2. The first input logic 30 is arranged for this object, so that in case of an enable state of the first enable signal E1, the first control signal C1 has an active state during the first half period of the carrier signal C2, whereas at the same time the second control signal C2 has an inactive state. During the second half period of the carrier signal CS, the first control signal C1 has an inactive state, while at the same time the second control signal C2 has an active state. When the first enable signal E1 is blocked, on the other hand, the first control signal and the second control signal have an inactive state.

The first driver 26 has on its output side a first transistor 28. The first transistor 28 is connected with a first transistor output terminal 28D to the supply voltage V. Furthermore, the first transistor 28 is connected with a second transistor output terminal 28S to a connection point A which forms an output of the first driver 26. The first transistor 28 has a first control electrode 28G by which the first transistor 28 can be controlled to a switch operation. The first control electrode 28G can be supplied with the first control signal C1, so that the first transistor 28 is turned on when the first control signal C1 is in an active state, and so that the first transistor 28 is turned off when the first control signal C1 is in an inactive state.

The first driver 26 has on the output side a second transistor 29. The second transistor is connected with a third transistor output terminal 29D to the connection point A. Furthermore, the second transistor 29 is connected with a fourth transistor output terminal 29S to ground G. The second transistor 29 has a second control electrode 29G by which the second transistor 29 can be controlled to a switch operation. The second control electrode 28G can be supplied with the second control signal C2, so that the second transistor 29 is turned on when the second control signal C2 is in an active state, so that the second transistor 28 is turned off when the second control signal C2 is in an inactive state.

The communication arrangement 1 has a second partial resistance 12B which is realized by a second driver 27.

The second driver 27 has on the input side a second driver data input 36 and a second driver enable input 37. A second input logic 35 of the second driver 27 is connected to the second driver data input 36 and to the second driver enable input 37. The second driver data input 36, the second driver enable input 37 and the second input logic 35 form part of the resistance change means 25. The second driver data input 36 can be supplied with the carrier signal CS. The second driver enable input 37 can be supplied with a second enable signal E2, while this second enable signal E2 can adopt two states, that is an enable state or a blocking state. The second input logic 35 is provided for generating and delivering a third control signal C3 and a fourth control signal C4. For this purpose, the second input logic 35 is arranged so that the third control signal C3 has an active state during the first half period of the carrier signal CS when the second enable signal E2 is enabled whereas, at the same time, the fourth control signal C4 has an inactive state. During the second half period of the carrier signal CS, the third control signal C3 has an inactive state whereas, at the same time, the fourth control signal C4 has an active state. When the second enable signal E2 is in a blocked state, the third control signal C3 and the fourth control signal C4 on the other hand are in an inactive state.

The second driver 27 has on its output side a third transistor 33. The third transistor 33 is connected with a fifth transistor output terminal 33D to the supply voltage V. The third transistor 33 is further connected with a sixth transistor output terminal 33S to a connection point B which forms an output of the second driver 27. The third transistor 33 has a third control electrode 33G by which the third transistor 33 can be controlled to a switch mode. The third control electrode 33G can be supplied with the third control signal C3, so that the third transistor 33 is turned on when the third control signal C3 is in an active state, so that the third transistor 33 is turned off and the third control signal C3 is in an inactive state.

The second driver 27 has on the output side a fourth transistor 34. The fourth transistor is connected with a seventh transistor output terminal 34D to the connection point B. Furthermore, the fourth transistor 34 is connected with an eighth transistor output terminal 34S to ground G. The fourth transistor 34 has a fourth control electrode 34G by which the fourth transistor 34 can be controlled to a switch operation. The fourth control electrode 34G can be supplied with the fourth control signal C4, so that the fourth transistor 34 is turned on when the fourth control signal C4 is in an active state and the fourth transistor 34 is turned off when the fourth control signal C4 is in an inactive state.

The states of the control signals C1, C2, C3, C4 allow a push-pull mode both for the two transistors 28 and 29 of the first driver 26 and the two transistors 33 and 34 of the second driver 27. Furthermore, the two transistors 28 and 29 of the first driver 26 can be controlled simultaneously to a blocking state and the two transistors 33 and 34 of the second driver 27 can so too, so that each driver can adopt a so-called tri-state on its output. The two drivers 26 and 27 are thus arranged as tri-state drivers. Furthermore, the output transistors 28, 29, 33 and 34 of the drivers 26 and 27 in the case at hand are advantageously formed by field effect transistors.

In the communication arrangement 1 shown in FIG. 3, in lieu of the first partial resistance 12A the first transistor 28 and the second transistor 29 are arranged in the communication arrangement 1 shown in FIG. 1. Furthermore are provided in the communication arrangement 1 shown in FIG. 3 the third transistor 33 and the fourth transistor 34 in lieu of the second partial resistance 12B of the communication arrangement 1 shown in FIG. 1. Each of the four transistors 28, 29, 33 and 34 can be operated in a switched mode and has a turn-on resistance in the turned-on state, which resistance is given by a minimum channel resistance which is typical of the transistor concerned. This typical minimum channel resistance is referenced $R_{DS\ on}$ in the literature (Tietze Schenk, Halbleiterschaltungstechnik, 6 Edition, Springerverlag, 1983, ISBN 3-540-12488-86). Therefore, a turned-on transistor of a partial resistance forms a basic resistance connected in parallel to the other partial resistance.

The resistance change means 25 include enable signal generating means 38 which are provided for generating and delivering the first enable signal E1 and the second enable signal E2. For this purpose, the data DA and the combined information CI are applied to the enable signal generating means 38.

In the following the function of the modulation means 7 is explained with reference to a third example of embodiment. The assumptions of the first example of embodiment shown in FIG. 1 are valid here too. Furthermore, it is assumed that the enable signal generating means 38 are arranged, so that the control signals C1, C2, C3 and C4 to be generated by the resistance change means 25 are identical with the control signals of the communication arrangement 1 shown in FIG. 1.

For generating the carrier amplitude, the enable signal generating means 38 accordingly generate, independently of the configuration information CI, a first enable signal E1 which is in an enable state, and a second enable signal E2 which is also in an enable state. Consequently, during the first half period of the carrier signal CS, a first output resistance 10 is formed by a parallel combination of the first transistor 28 and the third transistor 33, which makes a first charging current possible. During the second half period of the carrier signal CS, a second output resistance 10 is formed by a parallel combination of the second transistor 29 and the fourth transistor 34, which makes a second charging current possible. This achieves the alternating switching between the first charging current and the first discharging current for the oscillation circuit of the transmission means 8. This further achieves that both the first charging current and the first discharging current assume a maximum value, as this is assumed for the carrier amplitude.

For generating the modulation amplitude, the enable signal generating means 28 generate, in accordance with the assumptions defined above, a first enable signal E1 which is in an enable state during the first period and the during the second period of the carrier signal CS, and a second enable signal E2 which is in a blocking state during the first period and during the second period of the carrier signal CS. Thus a third output resistance is formed by the first transistor 28 during the first half period, which makes a second charging current possible. Furthermore, a fourth output resistance is formed by the second transistor 29, which makes a second discharging current possible. The proportion of the second charging current to the first charging current is as explained with respect to FIG. 1. The same holds for the second discharging current.

Since the two partial resistances 12A and 12B are formed by the transistors 28, 29, 33 and 34, an extremely simple and advantageous use of the turn-on resistance of a turned-on switching transistor for realizing the basic resistance is achieved. The use of a transistor on the output side of a driver further offers the advantage that this transistor can easily be driven.

Figure 4:
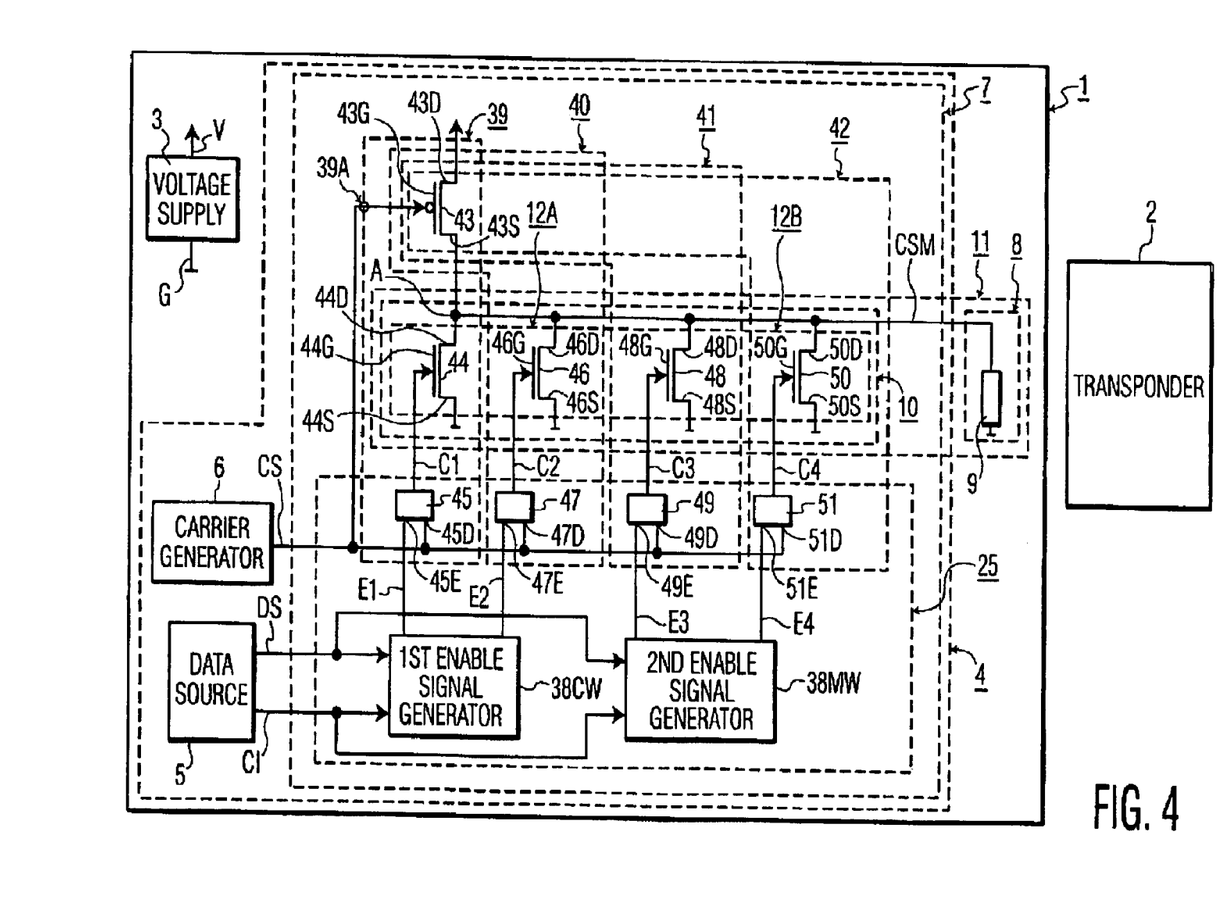
FIG. 4 shows in similar manner to FIG. 1 a communication arrangement in accordance with a fourth example of embodiment of the invention.

FIG. 4 shows in the form of a block diagram a communication arrangement 1 similar to the communication arrangement 1 shown in FIG. 2. The communication arrangement 1 shown in FIG. 4 includes modulation means 7. The modulation means 7 comprise four drivers, that is a first driver 39, a second driver 40, a third driver 41 and a fourth driver 42, and resistance change means 25.

The first driver 39 has on its output side a first transistor 43 and a second transistor 44. The first transistor 43 is arranged as a P-channel field effect transistor. The first transistor 43 has a first transistor output 43D, a first control electrode 43G and a second transistor output 43S. The second transistor 44 has a third transistor output 44D, a second control electrode 44G and a fourth transistor output 44S. The first driver 39 has on the input side a first input logic 45, which has a first driver data input 45D and a first driver enable input 45E and which is arranged for generating and producing a first control signal C1. The first control signal C1 can be applied to the second control electrode 44G. The first transistor 43 is connected with the first transistor output 43D to the supply voltage V. Furthermore, the second transistor output 43S is connected to the third transistor output 44D of the second transistor 44. Between the second transistor output 43S and the third transistor output 44D there is an output of the first driver 39, which is formed by a connection point A. The second transistor 44 is connected with its fourth transistor output 44S to ground G. The first driver 39 further has an electrode control input 39A, which is provided for directly controlling the first control electrode 43G. The carrier signal CS can be directly applied to the electrode control input 39A. In the present case, the carrier signal CS is defined as a sequence of logic ones and logic zeroes, a logic zero occurring during a first half period of the carrier signal CS and a logic one occurring during a second half period. A logic zero represents an inactive state in the present case and a logic one represents an active state in the present case. The first control electrode 43G is arranged so that the first transistor 43 is turned on when the first control electrode 43G is supplied with a logic zero of the carrier signal CS, is thus in the inactive state. The first transistor 43 is turned off when the first control electrode 43G is supplied with a logic one of the carrier signal CS, thus the active state.

The second driver 40 has on its output side a third transistor 46. The third transistor 46 has a fifth transistor output 46D, a third control electrode 46G and a sixth transistor output 46S. The second driver 40 has on the input side a second input logic 47, which has a second driver data input 47D and a second driver enable input 47E and which is arranged for generating and delivering a second control signal C2. The second control signal C2 is applied to the second control electrode 46G. The third transistor 46 is connected with its fifth transistor 46D to the connection point A. Furthermore, the sixth transistor 46S is connected to ground G.

The third driver 41 includes a fourth transistor 48 on its output side. The fourth transistor 48 has a seventh transistor output 48D, a fourth control electrode 48G and an eighth transistor output 48S. The third driver 41 has on its input side a third input logic 49, which has a third driver data input 49D and a third driver enable input 49E, and which is arranged for generating and delivering a third control signal C3. The third control signal C3 can be applied to the fourth control electrode 48G. The fourth transistor 48 is connected with its seventh transistor output 48D to the connection point A. Furthermore, the eighth transistor output 48S is connected to ground G.

The fourth driver 42 has a fifth transistor 50 on its output side. The fifth transistor 50 has a ninth transistor output SOD, a fifth control electrode 50G and a tenth transistor output 50S. The fourth driver 42 includes on its input side a fourth input logic 51, which has a fourth driver data input 51D and a fourth driver enable input 51E and which is used for generating and delivering a fourth control signal C4. The fourth control signal C4 can be applied to the fifth control electrode 50G. The fifth transistor 50 is connected with its ninth transistor output SOD to the connection point A. The tenth transistor output 50S is further connected to ground G.

Each of the transistors 44, 46, 48 and 50 is arranged as an N-channel field effect transistor. Each of the control electrodes 44G, 46G, 48G and 50G sets the respective transistor 44, 46, 48 or 50 to a turned-on state when the control signal C1, C2, C3, or C4 in an active state is applied to the control electrodes. Each of the control electrodes 44G, 46G, 48G and 50G sets the respective transistor 44, 46, 48 or 50 to a turned-off state when a control signal C1, C2, C3 or C4 is applied thereto which has an inactive state.

To each driver data input 45D, 47D, 49D or 51D can be applied the carrier signal CS. Each of the driver enable inputs 45E, 47E, 49E and 51E is provided for receiving its respective driver enable signal E1, E2, E3 and E4. Each of the driver enable signals E1, E2, E3 or E4 can take up an enable state and a blocking state.

When the enable state is there for the first driver enable signal E1, the first input logic 45 generates a first control signal C1 with an inactive state during the first half period of the carrier signal CS. During the second half period of the carrier signal CS, the first input logic 45 generates a first control signal C1 with an active state. The same holds for the second input logic 47, the third input logic 49 and the fourth input logic 51, so that in analogous manner, when the second driver enable signal E2, the third driver enable signal E3 and the fourth driver enable signal E4 occurs, respective control signals C2, C3 and C4 are generated.

In the communication arrangement 1 shown in FIG. 4, the second and third transistors 44 and 46 in lieu of the first partial resistance 12A of the communication arrangement 1 shown in FIG. 2 are provided. Furthermore, the fourth transistor 48 and the fifth transistor 50 in the communication arrangement 1 are provided in lieu of the second partial resistance 12B of the communication arrangement 1 shown in FIG. 2. Furthermore, in the communication arrangement 1 shown in FIG. 4 the first transistor 43 in lieu of the first resistor 13 and first switch 15 of the communication arrangement 1 shown in FIG. 2 is provided. The first transistor 43, which is in the turned-on state, the second transistor 44, which is in the turned-on state, and the fourth transistor 48, which is in the turned-on state, have each a resistance value. The third transistor 46, which is in the turned-on state, and the fifth transistor 50, which is in the turned-on state, have each a second resistance value, while the second resistance value is larger than the first resistance value.

The second transistor 44 and the third transistor 46 form a first partial resistance 12A. The fourth transistor 48 and the fifth transistor 50 form a second partial resistance 12B. Each of the transistors 44, 46, 48 and 50 can be set to the turned-on state or turned-off state by the respective control signal C1, C2, C3 or C4. Each transistor in its turned-on state forms a basic resistance included in a parallel circuit with the other partial resistance. The provision of two partial resistances 12A and 12B, which are formed by means of two transistors each 44 and 46; 48 and 50, makes that at least one of the two partial resistances 12A or 12B can be changed. Furthermore, generating separate control signals C1, C2, C3 and C4 for the transistors 44, 46, 48 and 50 and connecting the fifth transistor output 46D and the seventh transistor output 48D and the ninth transistor output 50D to the connection point A achieves that at least one of the two partial resistances 12A or 12B is used as a group of parallel connected drivers 39 and 40; 41 and 42 respectively, and that at least one of the drivers 39 or 40; 41 or 42 of the group can be added to or removed from the rest of the group.

Applying the carrier signal CS directly to the electrode control input 39A further advantageously achieves that a group of parallel arranged drivers 39 and 40; 41 and 42 respectively, which forms a partial resistance 12A or 12B, has for all the drivers 39, 40, 41 and 42 a common complementary transistor on the output side, that is, the first transistor 43.

The first input logic 45, the second input logic 47, the third input logic 49 and the fourth input logic 51 form part of the resistance change means 25. The resistance change means 25 have first enable signal generating means 38CW, arranged for generating the first enable signal E1 and the second enable signal E2. The resistance change means 25 further include second enable signal generating means 38MW arranged for generating the third enable signal E3 and the fourth enable signal E4. To the first enable signal generating means 38CW and the second enable signal generating means 38MW can be applied for this purpose the data DA and the combined information CI. The combined information CI contains a first combination group which relates to a combination of the control signals C1 and C2, and a second combination group which relates to a combination of the control signals C3 and C4.

In the following, the function of the modulation means 7 is explained with reference to a fourth example of embodiment, a fifth example of embodiment and a sixth example of embodiment. For all these examples of embodiment it holds that during the first half period of the carrier signal CS, the first transistor 43 forms an unchangeable output resistance, so that a charging current flows through this output resistance, which charging current causes the oscillation circuit to be charged.

With reference to the fourth example of embodiment, the present case explains the function of the modulation means 25 for the generation of an amplitude-modulated carrier signal CS with a positive degree of modulation and a variable modulation amplitude.

For generating the carrier amplitude, the resistance change means 25 in the present case are arranged so that, if a logic zero occurs in the data DA, the first enable signal generating means 38CW generate the enable state for the driver enable signals E1 and E2. Furthermore, the second enable generating means 38MW generate a blocking state for the driver enable signals E3 and E4. This provides a first output resistance, so that a first discharging current, which assumes a maximum value because the second transistor 44 is connected in parallel to the third transistor 46, flows through the first output resistance 11.

For generating the variable modulation amplitude, the resistance change means 25 are arranged so that, if a logic one occurs in the data DA, the second enable generating means 38MW generate driver enable signals E3 and E4 in accordance with the second combination group of the combined information CI. On the one hand, a second output resistance can be formed by generating the enable state for the third driver enable signal E3 and the blocking state for the fourth driver enable signal E4. A second discharging current which, however, assumes a smaller value than the maximum value of the first discharging current, flows through the second output resistance. On the other hand, a third output resistance can be formed by generating the enable state for the fourth driver enable signal E4 and generating the blocking state for the third driver enable signal E3. The third discharging current flows through the third output resistance, which discharging current, just like the second discharging current, assumes a smaller value than the maximum value of the first discharging current and assumes a value that can be distinguished from the value of the second discharging current. By the flowing of the second discharging current and the third discharging current, a variable modulation amplitude with a positive degree of modulation is generated during the amplitude modulation of the carrier signal CS.

With reference to the fifth example of embodiment, the function of the modulation means 25 for generating an amplitude-modulated carrier signal CSM with a negative degree of modulation and a variable carrier amplitude is explained in the present case.

For generating the modulation amplitude, the resistance change means 25 in the present case are arranged so that if a logic one occurs in the data DA, the first enable generating means 38CW generate the blocking state for the driver enable signals E1 and E2. Furthermore, the second enable generating means 38MW generate an enable state for the driver enable signals E3 and E4. This provides a first output resistance, so that a first discharging current, which assumes a maximum value due to the parallel circuit of the fourth transistor 44 and the fifth transistor 46, flows through the first output resistance 11.

For generating the variable carrier amplitude, the resistance change means 25 are arranged so that, if a logic zero occurs in the data DA, the first enable generating means 38MW generate driver enable signals E1 and E2 in accordance with the first combination group of the combined information C1. On the one hand, a second output resistance can be formed by generating the enable state for the first driver enable signal E1, and generating the blocking state for the second driver enable signal E2. A second discharging current which, however, assumes a smaller value than the maximum value, flows through the second output resistance. On the other hand, a third output resistance can be formed by generating the enable state for the second driver enable signal E2 and generating the blocking state for the first driver enable signal E1. A third discharging current which, just like the second discharging current, assumes a smaller value than the maximum value of the first discharging current, and which assumes a value that can be distinguished from the value of the second discharging current, flows through the third output resistance. The flowing of the second discharging current and of the third discharging current thus generates a variable carrier amplitude when the carrier signal is amplitude-modulated with a negative degree of modulation.

With reference to the sixth example of embodiment, the function of the modulation means 25 for generating an amplitude-modulated carrier signal CSM with the negative degree of modulation is explained in the present case, as is a switch-over for generating an amplitude-modulated carrier signal CSM with the positive degree of modulation. In the present case, the resistance change means 25 are arranged so that the first enable generating means 38CW generate driver enable signals E1 and E2 in accordance with the first combination group of the combined information CI, while the driver enable signals E3 and E4 have a blocking state, and the second enable generating means 38 CM generate driver enable signals E3 and E4 in accordance with the second combination group of the combined information CI, while the driver enable signals E1 and E2 have a blocking state.

For generating the carrier amplitude with the positive degree of modulation during the amplitude modulation and if a logic zero occurs in the data DA in accordance with the first combination group, a first output resistance is formed by generating the enable state for the first driver enable signal E1 and generating the blocking state for the second driver enable signal E2. A first discharging current, which assumes a maximum value, flows through the first output resistance.

For generating the modulation amplitude during the amplitude modulation with the positive degree of modulation, when a logic one in the data DA occurs, a second output resistance is formed by generating the enable state for the fourth driver enable signal E4 and generating the blocking state for the third driver enable signal E3. A second discharging current, which assumes a lower value than the maximum value of the first discharging current, then flows through the second output resistance.

In the communication arrangement 1 the change-over for generating an amplitude-modulated carrier signal CSM with the positive degree of modulation takes place in that the enable state and the blocking state are exchanged for the first combination group when a logic zero occurs in the data DA and for the second combination group when a logic one occurs in the data DA.

For generating the modulation amplitude with the negative degree of modulation during the amplitude modulation, a second output resistance is formed when a logic one occurs in the data DA, because the blocking state is generated for the fourth driver enable signal E4 and the enable state for the third driver enable signal E3. A third discharging current, which assumes a maximum value in analogy with the first discharging current, flows through the second output resistance.

For generating the carrier amplitude with the negative degree of modulation during the amplitude modulation, a fourth output resistance is formed when a logic zero occurs in the data DA, similarly to the first combination group, so that the blocking state is generated for the first driver enable signal E1 and the enable state is generated for the second driver enable signal E2. A fourth discharging current, which assumes a lower value than the maximum value of the third discharging current, then flows through the fourth output resistance.

Figure 5:
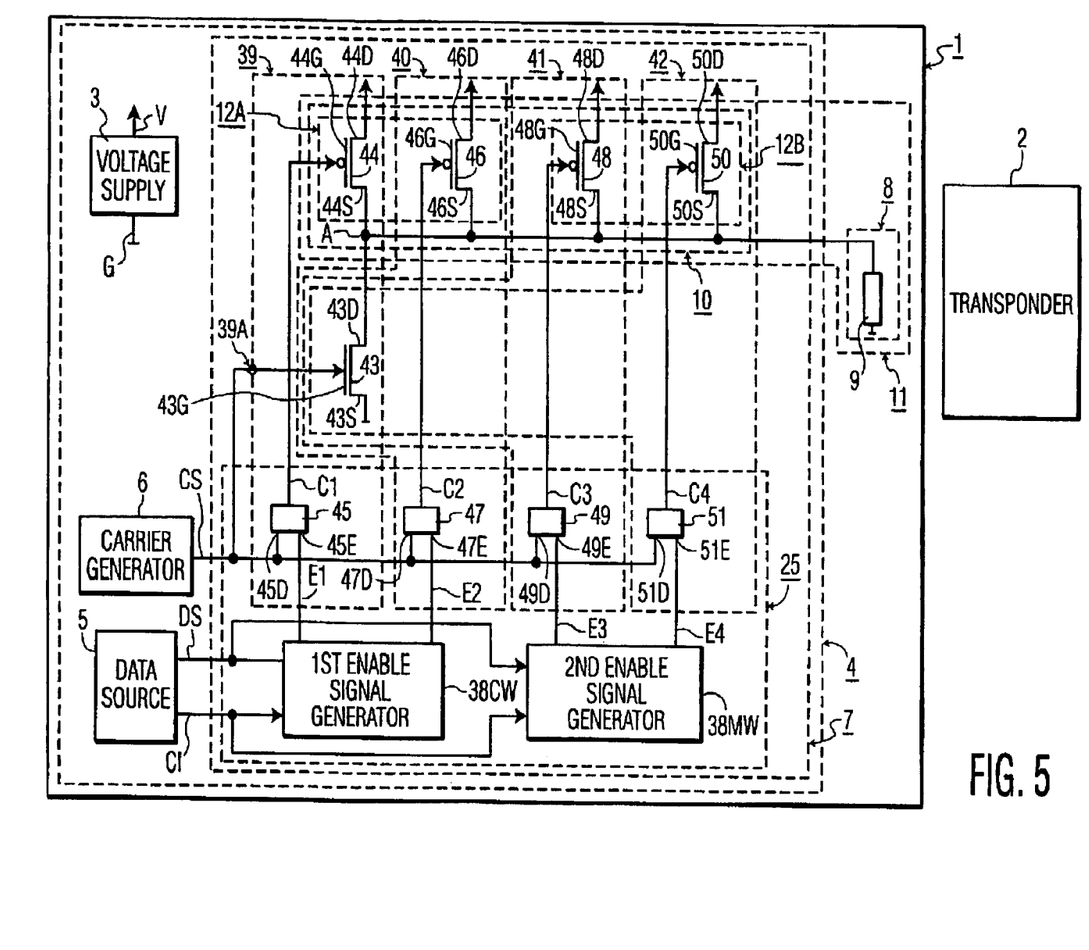
FIG. 5 shows in similar manner to FIG. 1 a communication arrangement in accordance with a fifth example of embodiment of the invention.

FIG. 5 shows in the form of a block diagram a communication arrangement 1 similar to the communication arrangement 1 shown in FIG. 4.

Different from the communication arrangement 1 shown in FIG. 4, the communication arrangement 1 shown in FIG. 5 includes drivers 39, 40, 41 and 42 which have a transistor 43 on the output side, which transistor is arranged as an N-channel field effect transistor. The drivers 39, 40, 41 and 42 further have on their output sides the transistors 44, 46, 48 and 50 of which each one is arranged as a P-channel field effect transistor. Accordingly, the transistor 43 is connected with the first transistor output 43D to the connection point A and with the second transistor output 43S to ground G. The second transistor 44 is connected with the third transistor output 44D to the supply voltage V and with the fourth transistor output 44S to the connection point A. The transistors 46, 48 and 50 are connected between the supply voltage V and the connection point A by analogy with the transistor 44. The function of the communication arrangement 1 shown in FIG. 5 is thus identical with the function of the communication arrangement 1 shown in FIG. 4.

When the communication arrangement 1 is realized, at least part thereof, for example the modulation means 7 of the electric circuit 4 are arranged as an integrated circuit. Consequently, also the drivers 39, 40, 41 and 42 included in the modulation means 7 are used as part of the integrated circuit. This provides the advantage that the modulation means 7 in the course of the circuit design of the integrated circuit can already be taken into account, which, on the one hand, considerably simplifies the circuit design and, on the other hand, enables a considerable saving of room and a considerable saving of costs for the realization.

The integrated circuit is realized as a CMOS integrated circuit, because a currently optimally available technology is used then. Consequently, also the drivers are CMOS drivers. The transistors on the output side are arranged as MOS field effect transistors (MOS-FET). Furthermore, the MOS-FETs in the integrated circuit are arranged so that the basic resistances of the individual transistors of the drivers are not the same. In this context it should be observed that when the integrated circuit is realized for two MOS-FETs, where a first MOS-FET has a first turn-on resistance and a second MOS-FET a second turn-on resistance, a proportion of the two turn-on resistances to each other can be reproduced relatively well. This good reproducibility of the proportion of the turn-on resistances is used as follows when the changeable output resistance 10 of the modulation means 7 is realized in CMOS technology.

First a matrix is made of 60 resistances in the integrated circuit. Each of these resistances is formed by means of the turn-on resistance from a respective number of N-FETs. The matrix has a first column, a second column, a third column and a fourth column of resistances. Each column has four rows, thus a first row, a second row, a third row and a fourth row of resistances. In the first row of each column there is a resistance which has a first resistance value. In the second row of each column there is a resistance which has a second resistance value. In the third row of each column there is a resistance which has a third resistance value. In the fourth row of each column there is a resistance which has a fourth resistance value. The second resistance value is distinguished from the first resistance value by the factor $2^1$. The third resistance value is distinguished from the first resistance value by the factor $2^2$. The fourth resistance value is distinguished from the first resistance value by the factor $2^3$. In consequence, the resistance values of all four resistances have a dual proportion to each other.

The resistance values of the resistances in the columns, on the other hand, are distinguished by a factor $k^n$, where n can assume the values zero, one, two and three and where for k is advantageously provided a value slightly deviating from the value of two. In the present case the value for k is selected to be 77/40.

The logic circuit included in the resistance change means 25 is provided and arranged for activating the resistors of the matrix. Each activated resistance of the matrix is then included in a parallel combination with all the other activated resistances of the matrix, so that the parallel combination forms a total resistance. For this purpose, the logic circuit on the one hand activates the rows and, on the other hand, activates the columns. The activation of the rows is done with four bits, where each bit activates one row. The activation of the columns is done with two bits, where the numbers zero, one, two and three can be formed with the two bits. When the two bits form the number zero, the first column is activated. When the two bits form the number one, the first and the second column are activated. When the two bits form the number two, the first, the second and the third column are activated. When the two bits form the number three, all four columns are activated. The choice of the above value for the factor k has proved to be highly advantageous in the present case, because then there is an extremely smooth pattern of the total resistance formed as a function of the two bits and four bits. Furthermore, for the total resistance value of the resistances activated in the matrix, there is a fine adjustment possible of the total resistance for large resistance values and a coarse adjustment of the total resistance for small resistance values.

The two bits for activating the columns and the four bits for activating the rows are applied to the logic circuit included in the resistance change means 25 via combined information CI. In the present case the data source 5 produces two types of combined information CI, that is a carrier combination and a modulation combination. The carrier combination is stored in a carrier register of the logic circuit and the modulation combination is stored in a modulation register of the logic circuit.

While the data source 5 delivers data DA to the resistance change means 25 included in the modulation means 7, the resistance change means 25 form the output resistance 10 in accordance with the data DA, thus the total resistance of the matrix of the modulation means 7. When a logic zero occurs in the data DA, the logic circuit uses, on the one hand, the carrier combination for forming a first total resistance of the matrix, thus a first output resistance 10 of the modulation means 7, so that the carrier amplitude is generated. On the other hand, when a logic one occurs in the data DA, the logic circuit uses the modulation combination for forming a second total resistance of the matrix, thus a second output resistance 10 of the modulation means 7, so that the modulation amplitude is generated.

In the case at hand, in addition to the formation of the first output resistance 10 for generating the carrier amplitude, there are sixty-two different second output resistances 10 more for generating sixty-two different modulation amplitudes, whereas with these sixty-two second output resistances 10 both the amplitude modulation with the positive degree of modulation and the amplitude modulation with the negative degree of modulation is taken into account.

When the characteristic feature according to the invention is provided that the drivers 39, 40, 41 and 42 of a group can be switched on and off with respect to the rest of the group, the advantage of a considerably simplified amplitude modulation is obtained.

Furthermore, in the communication arrangement 1 according to the invention, a common complementary transistor 43 offers the advantage that when a plurality of drivers 39, 40, 41 and 42 is provided in the modulation means 7, there is a considerable saving of costs.

The communication arrangement 1 according to the invention furthermore offers the advantage that because different basic resistances of the transistors 44, 46, 48 and 50 of the drivers 39, 40, 41 and 42 are provided, variable wide-range resistance values for the output resistance 10 of the modulation means 7 are formed in a large range. This is particularly important with the generation of an amplitude-modulated carrier signal having different degrees of modulation and generated in accordance with the data DA, while, especially if suitable basic resistances are selected, the degrees of modulation can be generated in an advantageous and simple manner.

In the communication arrangement 1 according to the invention, the fact that the drivers 39, 40, 41 and 42 are provided as a component part of the integrated circuit has proved to be extremely advantageous, because this simplifies the manufacture of the drivers and makes them room-saving and cost-effective.

Figure 6:
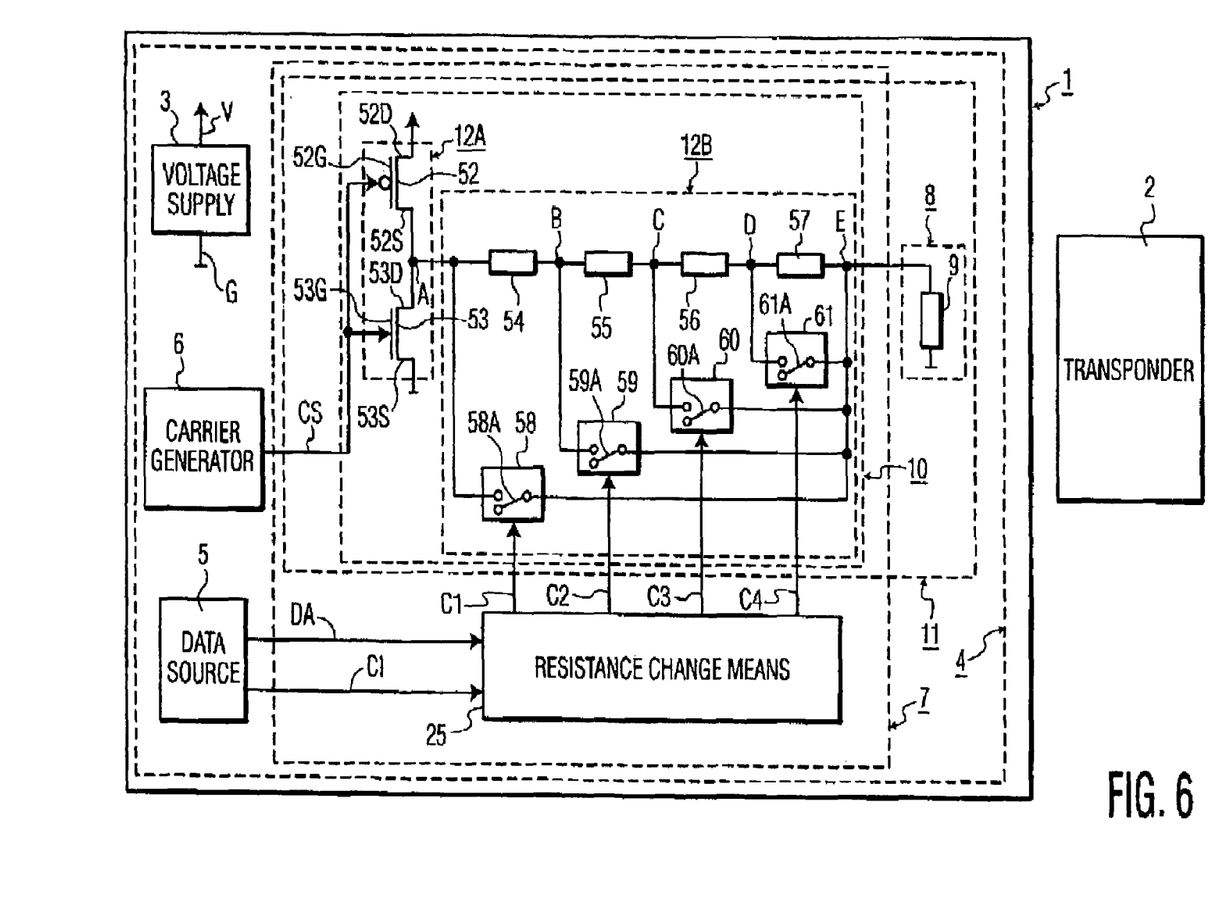
FIG. 6 shows in similar manner to FIG. 1 a communication arrangement in accordance with a sixth example of embodiment of the invention.

FIG. 6 shows in the form of a block diagram a communication arrangement 1 similar to the communication arrangement 1 shown in FIG. 1.

In the communication arrangement 1 shown in FIG. 6, the first partial resistance 12A is formed by a first transistor 52 and a second transistor 53. The first transistor 52 is arranged as a P-channel field effect transistor. The second transistor 53 is arranged as an N-channel field effect transistor. The first transistor 52 has a first transistor output 52D and a second transistor output 52S and a first control electrode 52G. The second transistor 53 has a third transistor output 53D and a fourth transistor output 53S and a second control electrode 53G. The first transistor output 52D is connected to the supply voltage V. The fourth transistor output 53S is connected to ground G. Between the second transistor output 52S and the third transistor output 53D is the connection point A. The first control electrode 52G and the second control electrode 53G can be supplied with the carrier signal CS. The first transistor 52 is in a turned-on state during a first half period of the carrier signal CS, whereas the second transistor 53 is in a turned-off state. The first transistor 52 is in a turned-off state during a second half period, whereas the second transistor 53 is in a turned-on state. The first transistor 52 and the second transistor 53 have a certain basic resistance in the turned-on state.

In the communication arrangement 1 the second partial resistance 12B is formed by a first resistor 54, a second resistor 55, a third resistor 56 and a fourth resistor 57 and by switching means which are in the form of a first switch 58, a second switch 59, a third switch 60 and a fourth switch 61. The switching means, which are provided for combining the two partial resistances 12A and 12B, in the present case allow for a series combination of the two partial resistances 12A and 12B. The first resistor 54 is connected in series to the connection point A. To the first resistor 54 is connected in series the second resistor 55, to the second resistor 55 is connected in series the third resistor 56 and to the third resistor 56 is connected in series the fourth resistor 57. The input resistance 9 of the transmitting means 8 is connected in series to the fourth resistor 57. Between the first resistor 54 and the second resistor 55 there is a connection point B. Between the second resistor 55 and the third resistor 56 there is a connection point C. Between the third resistor 56 and the fourth resistor 57 there is a connection point D. Between the fourth resistor 57 and the input resistance 9 there is a connection point E. In a parallel circuit with the four resistors 54, 55, 56 and 57 is included the first switch, which is connected, on the one hand, to the connection point A and, on the other hand, to the connection point E. In a parallel circuit with the series combination formed by the second resistor 55, the third resistor 56 and the fourth resistor 57 is included the second switch 59, which is connected, on the one hand, to the connection point B and, on the other hand, to the connection point E. In a parallel combination with the series combination formed by the third resistor 56 and the fourth resistor 57 is included the third switch 60, which is connected, on the one hand, to the connection point C and, on the other hand, to the connection point E. In a parallel circuit with the fourth resistor 57 is included the fourth switch 61, which is connected, on the one hand, to the connection point D and, on the other hand, to the connection point E.

The first switch 58 has a first make contact 58A, the second switch 59 has a second make contact 59A, the third switch 60 has a third make contact 60A and the fourth switch 61 has a fourth make contact 61A. Each of the make contacts 58A, 59A, 60A or 61A is electronically controllable by a control signal and is opened in an idle state and closed in a working state. When a make contact 58A, 59A, 60A or 61A is supplied with its control signal that adopts an active state, the make contact is in its working state. When a make contact 58A, 59A, 60A or 61A is supplied with its control signal that adopts an inactive state, the make contact is in its idle state.

The data source 5 in the present case is provided for delivering the data DA and delivering combined information CI. The resistance change means 25 are provided for receiving the data DA and the combined information CI. The resistance change means 25 are further provided for generating and delivering control signals C1, C2, C3 and C4. The make contacts 58A, 59A, 60A and 61A are supplied with the control signals C1, C2, C3 and C4.

In the following the function of the modulation means 7 is explained with the aid of a seventh example of embodiment. The assumptions of the first example of embodiment are valid here too. Furthermore, it is assumed that the four resistors 54, 55, 56 and 57 have different values.

For generating the carrier amplitude if a logic zero occurs in the data DA, the resistance change means 25 generate a first control signal C1, which has an active state. As a result, the connection point A is directly connected to the connection point E. In the present case, during a first half period of the carrier signal CS, a first charging current flows from the supply voltage V, via the first resistor 52 forming the first partial resistance 12A during this first half period, into the oscillation circuit of the transmitting means 8. Furthermore, during a second half period of the carrier signal CS, a first discharging current flows from the oscillation circuit, via the second transistor 53 forming the first partial resistance 12A during this second half period, to ground G. The first discharging current and the first charging current have a maximum value, because the closed switch 58 forms a second partial resistance 12B having a zero Ohm resistance value.

For generating the modulation amplitude if a logic one occurs in the data DA, the resistance change means 25 generate the control signals C1, C2, C3 and C4 in accordance with the combined information CI. The first control signal CI always has an inactive state. This achieves that the minimum value of the second partial resistance 12B is given by the value of the first resistor 54. By means of the three control signals C2, C3 and C4, four different degrees of modulation can be generated while the carrier signal CS is being amplitude modulated.

A first degree of modulation can be generated then with the aid of the first combined information CI in accordance with which the second control signal C2 has an active state and the third control signal C3 and the fourth control signal C4 have an inactive state. The second partial resistance 12B is then formed by the first resistor 54, so that a second charging current and a second discharging current arise whose values are smaller than the maximum value occurring during the generation of the carrier amplitude.

A second degree of modulation can be generated with the aid of second combined information CI in accordance with which the third control signal C3 has an active state and the second control signal C2 and the fourth control signal C4 have an inactive state. The second partial resistance 12B is then formed by a series combination of the first resistor 54 and the second resistor 55, so that there is a third charging current and a third discharging current whose values are smaller than the maximum value occurring while the carrier amplitude is being generated and whose values are further smaller than the values of the second charging current and of the second discharging current.

A third degree of modulation can be generated with the aid of third combined information CI in accordance with which the fourth control signal C4 has an active state and the second control signal C2 and the third control signal C3 have an inactive state. The second partial resistance 12B is then formed by a series combination of the first resistor 54, the second resistor 55 and of the third resistor 56, so that a fourth charging current and a fourth discharging current arise whose values are smaller than the maximum value occurring while the carrier amplitude is being generated and whose values are further smaller than the values of the charging current and discharging current generated in accordance with the first combined information CI and the second combined information CI.

A fourth degree of modulation can be generated with the aid of fourth combined information CI in accordance with which the three control signals C2, C3 and C4 have an inactive state. The second partial resistance 12B is formed by a series combination of the first resistor 54, the second resistor 55, the third resistor 56 and the fourth resistor 57, so that there is a fifth charging current and a fifth discharging current whose values are smaller than the maximum value occurring while the carrier amplitude is being generated and whose values are further smaller than the values of the charging currents and discharging currents generated in accordance with the first combined information CI, in accordance with the second combined information CI and in accordance with the third combined information CI.

In this context should be observed that considerably more degrees of modulation can be generated with a different arrangement of the second partial resistance 12B. If, for example, the first switch 58 is connected in parallel to the first resistor 54, the second switch 59 is connected in parallel to the second resistor 55, the third switch 60 in parallel to the third resistor 56 and the fourth switch 61 in parallel to the fourth resistor 57, up to fifteen (15) degrees of modulation can be generated with suitable combined information CI.

Because the second partial resistance 12B is formed by resistors 54, 55, 56 and 57, which can be connected in series, and by switches 58, 59, 60 and 61 for bridging the resistors 54, 55, 56 and 57 or for bridging groups of resistors 54, 55, 56, 57, modulation means 7 are realized in a simple fashion, while the changeable output resistance 10 is formed by series-connected partial resistances 12A and 12B.

The invention is not restricted to the above examples of embodiment. There may be observed that the modulation means, which have a changeable output resistance, may be arranged for generating the modulated carrier signal both with a symmetrical amplitude modulation and with an asymmetrical amplitude modulation.

It should be observed that the transmitting means may also be arranged by a capacitive coupling or with the aid of an antenna for transmitting the modulated carrier signal.

It should be observed that the changeable output resistance of the modulation means may also be arranged as a communication line terminal for terminating the resistance of a communication line, so that in an advantageous manner a flexible adaptation of the resistance of an output resistance of the communication line is achieved.

It should further be observed that the changeable output resistance of the modulation means may also be arranged as an input resistance of the communication arrangement, so that in an advantageous manner a flexible adaptation of the resistance of an input resistance of this communication arrangement is achieved.

It should further be observed that the changeable output resistance of the modulation means may also be arranged as an output parallel combination of a plurality of CMOS operational amplifiers.

It may finally be observed that the transmitting means normally have an adaptation network for adapting the resistance of the input resistance to a nominal value.

What is claimed is:

1. A communication arrangement (1) by which data (DA) can be transmitted to a transponder (2), comprising:
    a data source (5) for providing the data (DA),
    a carrier signal generator (6) for generating a carrier signal (CS), modulation means (7) for modulating the carrier signal (CS) in accordance with the data (DA) to produce a modulated carrier signal (CSM), and
    transmitting means (8) having a nominally constant input resistance (9) responsive to the modulated carrier signal (CSM)
    wherein the modulation means (7) includes an output resistance (10) which together with the input resistance (9) of the transmitting means (8) forms a resistance network (11), characterized in that:
    the output resistance (10) can be changed and resistance change means (25) are used for changing the output resistance (10) of the modulation means (7) in accordance with the data (DA),
    wherein the changeable output resistance (10) of the modulation means (7) can be combined from a first partial resistance (12A) and a second partial resistance (12B) and in that switching means (15, 16, 19 and 20) are provided for connecting the two partial resistances (12A, 12B) in parallel, and
    wherein at least one of the two partial resistances (12A, 12B) is realized by means of at least one driver (26, 27; 39, 40, 41, 42), while the driver (26, 27; 39, 40, 41, 42) has a transistor (28, 29, 33, 34; 44, 46, 48, 50) on its output side, wherein said transistor can be driven to a switching operation in which a turned-on transistor (28, 29, 33, 34; 44, 46, 48, 50) forms a basic resistance connected in a parallel combination to the first or second partial resistance (12A, 12B).

2. A communication arrangement (1) as claimed in claim 1, characterized in that the driver (26, 27; 39, 40, 41, 42) is arranged as a CMOS driver.

3. A communication arrangement (1) as claimed in claim 1, characterized in that at least one of the partial resistances (12A, 12B) can be changed.

4. A communication arrangement (1) as claimed in claim 1, characterized in that at least one of the two partial resistances (12A, 12B) is provided as a group of drivers (39, 40, 41, 42) connected in parallel and
    in that at least one of the drivers (39, 40, 41, 42) of the group can be turned on and off relative to the rest of the group.

5. A communication arrangement (1) as claimed in claim 4, characterized in that the basic resistances of the transistors (44, 46, 48, 50) of the drivers (39, 40, 41, 42) are unequal.

6. A communication arrangement (1) as claimed in claim 4, characterized in that a group of parallel-arranged drivers (39, 40, 41, 42) forming the two partial resistance (12A, 12B) have a common complementary transistor (43) on the output side of the drivers (39, 40, 41, 42).

7. A communication arrangement (1) as claimed in claim 2, characterized in that at least one driver (39, 40, 41, 42) is part of an integrated circuit.

* * * * *